United States Patent [19]

Chan et al.

[11] Patent Number: 5,126,280

[45] Date of Patent: * Jun. 30, 1992

[54] STACKED MULTI-POLY SPACERS WITH DOUBLE CELL PLATE CAPACITOR

[75] Inventors: Hiang C. Chan; Pierre Fazan, both of Boise, Id.

[73] Assignee: Micron Technology, Inc., Boise, Id.

[*] Notice: The portion of the term of this patent subsequent to Jan. 28, 2009 has been disclaimed.

[21] Appl. No.: 653,035

[22] Filed: Feb. 8, 1991

[51] Int. Cl.$^5$ .................. H01L 21/70; H01L 27/00
[52] U.S. Cl. ................................. 437/52; 437/60; 437/919
[58] Field of Search ............... 437/48, 52, 919; 357/23.6

[56] References Cited

U.S. PATENT DOCUMENTS 5,053,351 11/1991 Fazan et al. ................. 437/52
5,061,650 11/1991 Dennison et al. ............ 437/52

FOREIGN PATENT DOCUMENTS 0074752 3/1989 Japan ......................... 437/919
0307257 12/1989 Japan ......................... 437/52
0295709 12/1988 United Kingdom .......... 437/52

OTHER PUBLICATIONS

"A Novel Stacked Capacitor Cell With Dual Cell Plate for 64Mb DRAMs", by H. Arima et al. pp. 651-654, 1990 IEEE.

Primary Examiner—Olik Chaudhuri
Assistant Examiner—Loc Q. Trinh
Attorney, Agent, or Firm—David J. Paul

[57] ABSTRACT

A multi-poly spacer, double-plate, stacked capacitor or MDSC using a modified stacked capacitor storage cell fabrication process. The MDSC is made up of a rectangular boxed-shaped polysilicon storage node structure, having multiple poly post residing in a buried contact used to connect the MDSC to an active area. The polysilicon storage node structure is overlaid by polysilicon with a dielectric sandwiched in between to form a completed MDSC. Developing the MDSC from a planarized surface allows the capacitor to be fabricated with only 2 photomask steps. With the 3-dimensional shape and a texturized surface of a polysilicon storage node plate, substantial capacitor plate surface area of 100% or more is gained at the storage node.

15 Claims, 14 Drawing Sheets

STACKED MULTI-POLY SPACERS WITH DOUBLE CELL PLATE CAPACITOR

FIELD OF THE INVENTION

This invention relates to semiconductor circuit memory storage devices and more particularly to a process to develop texturized three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with interplate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A paper submitted by H. Arima et al., entitled "A NOVEL STACKED CAPACITOR CELL WITH DUAL CELL PLATE FOR 64Mb DRAMs," IEDM, Dig. Tech. Papers, pp. 651-654, 1990, herein incorporated by reference, discusses a stacked capacitor with dual cell plates (DCP).

The DCP structure and its development is shown in FIGS. 2a-f, pp. 652 of the article mentioned previously. The storage node is developed by two polysilicon layers which forms a rectangular box shaped poly structure. Capacitor dielectric film surrounds the surface of the rectangular poly structure and is then covered with poly layer that creates the upper cell plate to complete the storage capacitor cell. This process takes a total of four photo mask steps; two photo steps to open the buried contacts and delineate the poly buffer layer (as in FIG. 2a), one photo step to reopen the buried contact once the surface has been coated with oxide that is planarized followed by depositions of poly, cell dielectric, and poly respectively (as shown in FIG. 2c), and one photo step to pattern the storage node plate (as shown in FIG. 2e).

The present invention further develops an existing stacked capacitor fabrication process to construct a more advanced three-dimensional stacked capacitor cell than that of the DCP and requires only a total of two photomask steps.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional double plate stacked capacitor having multiple storage node cell plate posts, referred to hereinafter as (m)ulti-poly spacer (d)ouble-plate (s)tacked (c)apacitor or MDSC. The MDSC design defines a capacitor storage cell that in the present invention is used in a DRAM process, however it will be evident to one skilled in the art to incorporate these steps into other processes requiring memory cells such as VRAMs, EPROMs or the like.

After a silicon wafer is prepared using conventional process steps, the present invention develops the MDSC by creating a poly structure, having multi-poly spacers, with the entire structure conforming to the wafer's topology formed by two adjacent digit lines running perpendicular to and over the top of three adjacent word lines, thus resulting in increased capacitor plate surface area for each storage cell. Such a structure is a vast improvement over the DCP cell as only two photomask steps are required instead of four, while at the same time capacitance is greatly increased over a conventional STC cell.

DETAILED DESCRIPTION OF THE PREFERRED EMBODIMENT

The invention is directed to maximizing storage cell surface area in a high density/high volume DRAM fabrication process, in a sequence shown in FIGS. 1–12b.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide. The active areas can be arranged in interdigitated columns and non-interdigitated rows or simply parallel and in line to one another in both the vertical and horizontal directions. The active areas are used to form active MOS transistors that can be doped as NMOS or PMOS type FETs depending on the desired use.

Figure 1:
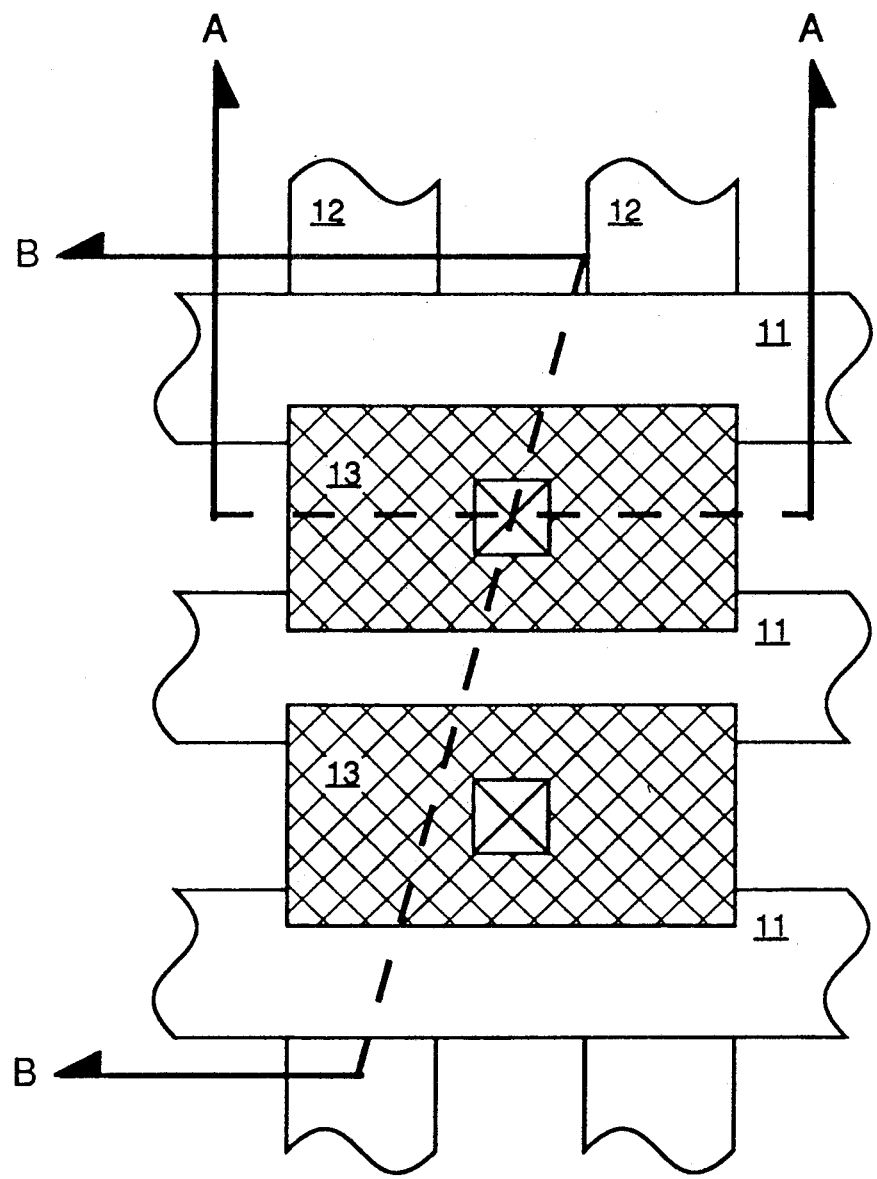
FIG. 1 is a top planar view of a portion of an in-process wafer showing digit lines, word lines and storage capacitors.

FIG. 1 shows a top planar view portion of a completed multilayered memory array with the main building blocks comprising digit lines 11, word lines 12 and a storage node plate 13 of an MDSC.

Figure 2:
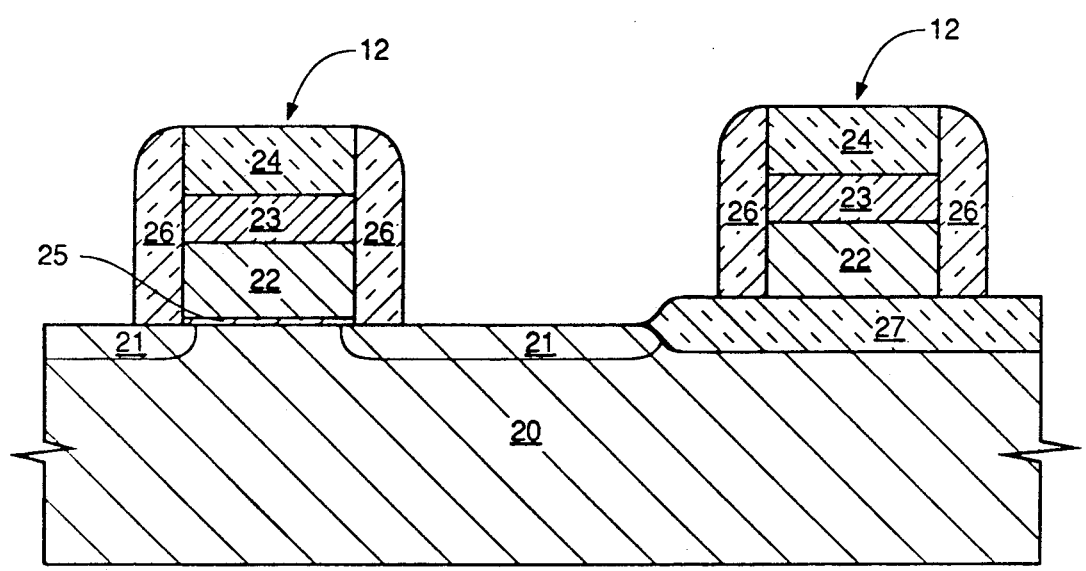
FIG. 2 is a cross-sectional view through broken line A—A of FIG. 1.

As shown in FIG. 2, poly 22, covered with silicide 23 and dielectric 24 (either oxide or nitride) are patterned to serve as word lines 12. Word lines 12 are further isolated from one another as well as subsequent conductive layers by dielectric spacers 26 (also either oxide or nitride) that have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to word lines 12.

Figure 3:
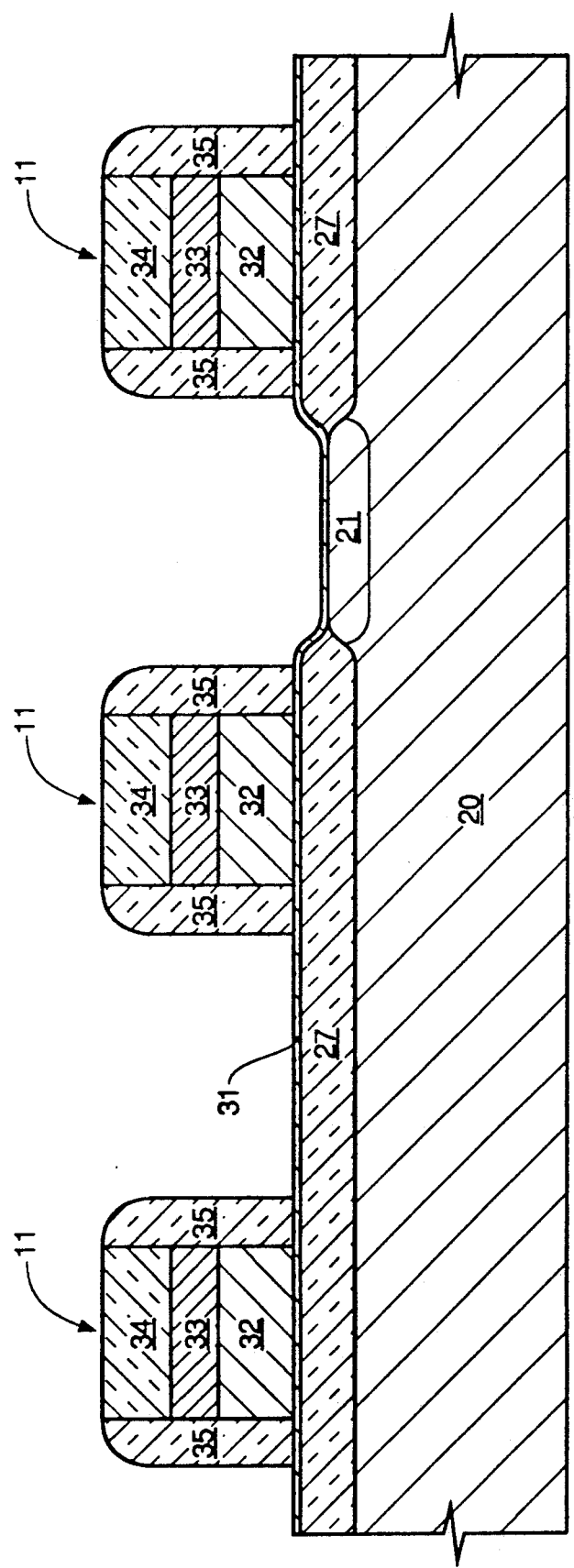
FIG. 3 is a cross-sectional view through broken line B—B of FIG. 1.

As shown in FIG. 3, an oxide layer 31 is deposited over the entire wafer array surface followed by buried digit line contacts patterning and etch. Following the etching of a digit line buried contact, blanket depositions of polysilicon 32, silicide 33 and dielectric 34 are performed respectively. Dielectric 34 can be either nitride or oxide and is deposited by chemical vapor deposition (CVD) which is preferred for its excellent conformity. The layers of polysilicon 32, silicide 33 and dielectric 34 are patterned and etched to serve as parallel digit lines 11. Polysilicon 32 has previously been conductively doped to electrically couple with silicide 33 to serve as the conductor for digit lines 11. Digit lines 11 run perpendicular to and over the top of word lines 12 (shown in FIG. 2) and conform to the wafer surface resulting in a waveform-like topology running in both the digit line and word line directions. A second dielectric, such as nitride or oxide is now deposited, followed by an anisotropic etch to form vertical dielectric spacers 35.

Up to this point, process flow has followed that of an array comprising conventional stacked capacitor cells. From this point forward, the process is unique to an array having MDSC-type storage capacitors.

FIGS. 4–12b show the formation of the MDSC seen from the cross-sectional view A—A of FIG. 1, showing a cross-section of parallel word lines 12 to present clearer views of the present invention. Therefore, the invention will be described from here on as seen from the word line cross-section.

Figure 4:
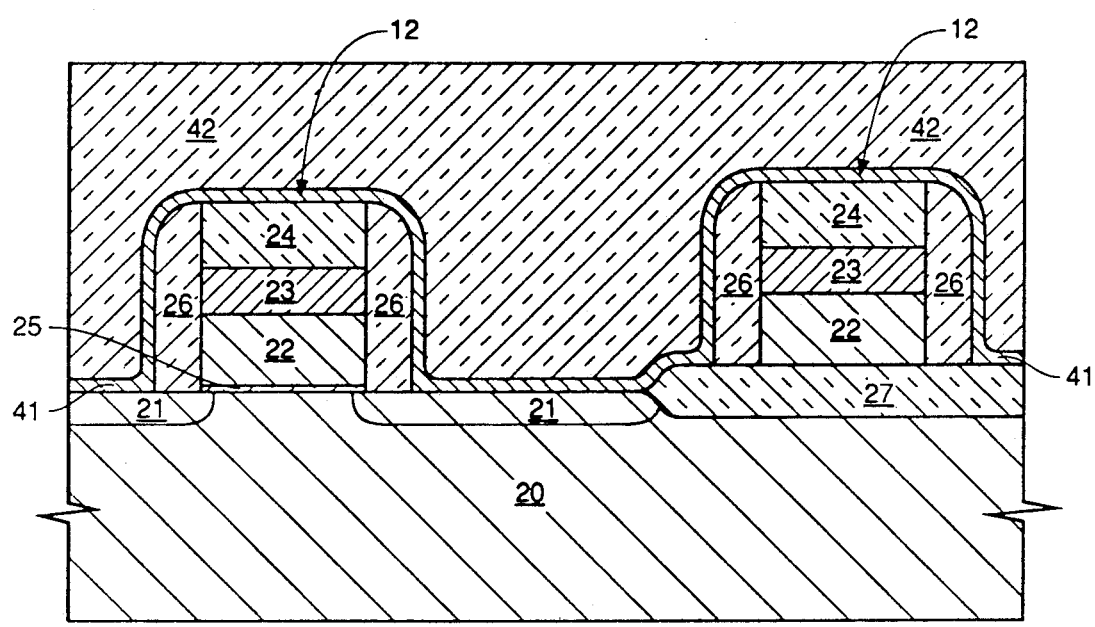
FIG. 4 is a cross-sectional view of the in-process wafer portion of FIG. 2 following a conformal nitride deposition, a conformal oxide deposition and planarization.

As shown in FIG. 4, word lines 12 and their subsequent isolation layers are then covered with dielectric 41 to a preferred thickness of 500 to 2000 angstroms preferably by CVD. In the preferred embodiment, dielectric 41 must be a layer of nitride. Following dielectric 41 deposition, conformal oxide 42 is deposited and then planarized to obtain a flat wafer surface.

Figure 5:
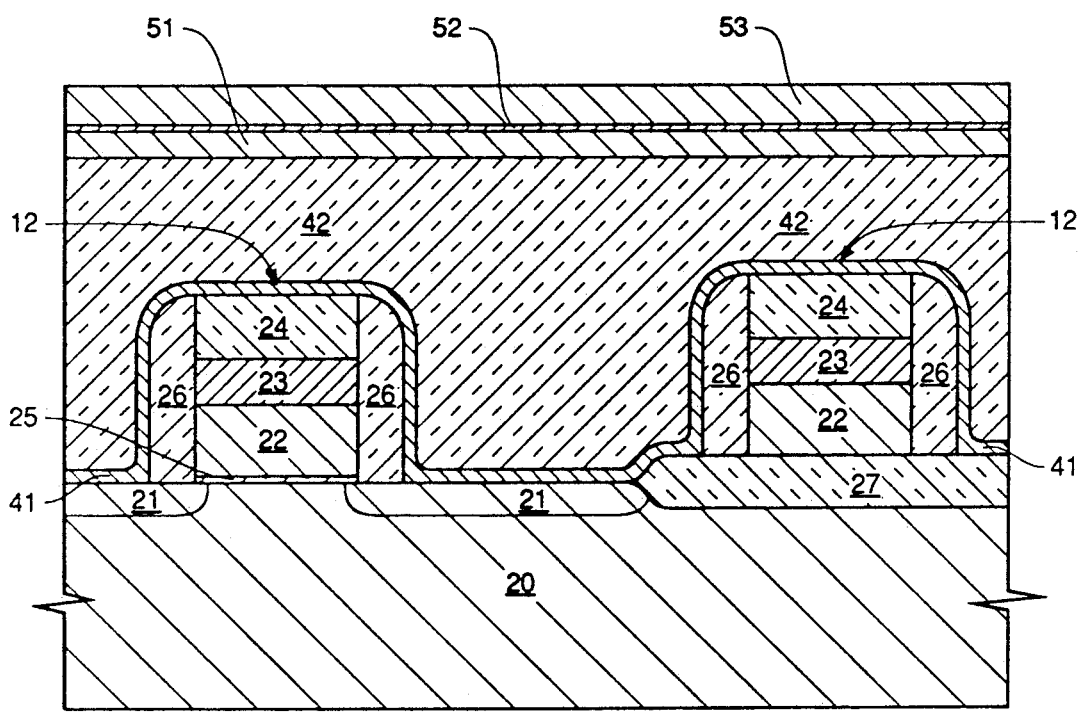
FIG. 5 is a cross-sectional view of the in-process wafer portion of FIG. 4 following depositions of polysilicon, a cell dielectric film and polysilicon, respectively.

As shown in FIG. 5, a layer of poly 51, a dielectric film 52 and a layer of poly 53 are deposited sequentially on the planarized oxide 42. Dielectric film 52 will be utilized as a capacitor cell dielectric and materials having a high dielectric constant such as nitride, an oxide-nitride compound or $Ta_2O_5$ should be used.

Figure 6:
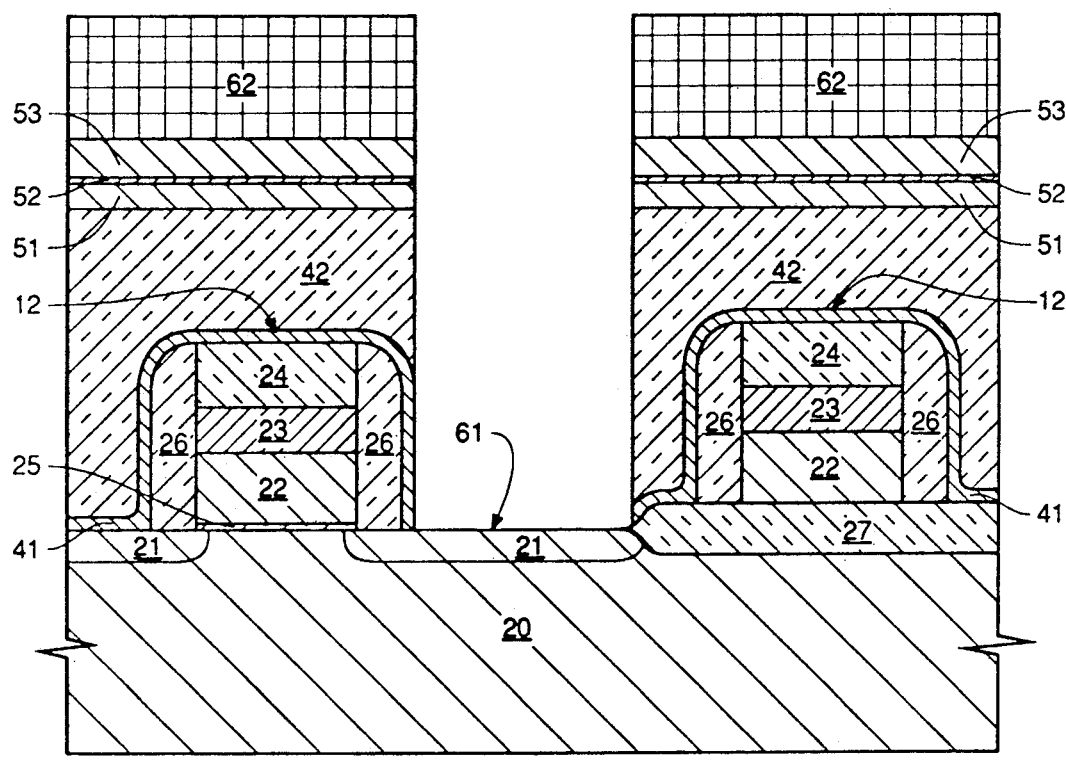
FIG. 6 is a cross-sectional view of the in-process wafer portion of FIG. 5 following a buried contact photo and etch.

As shown in FIG. 6, buried contact 61 is aligned to word lines 12 by covering all of the wafer surface area with photoresist 62. After applying an appropriate photomask, a buried contact anisotropic etch provides an opening to locate contact 61.

Figure 7:
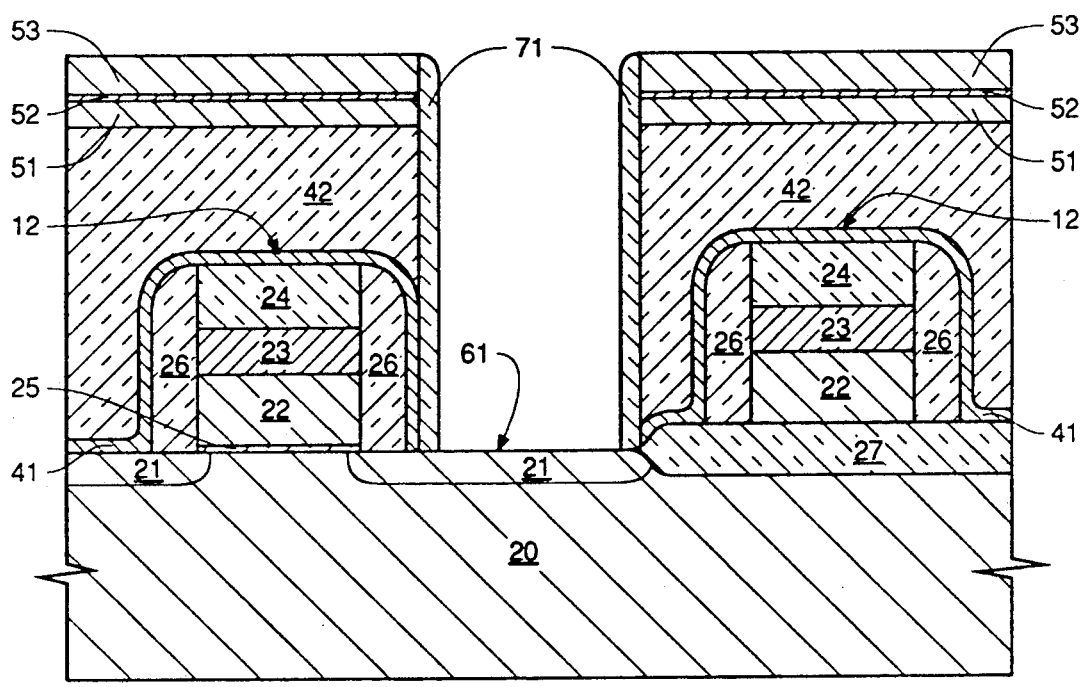
FIG. 7 is a cross-sectional view of the in-process wafer portion of FIG. 6 following a photoresist strip, a blanket deposition of conformal oxide and an oxide spacer etch.

As shown in FIG. 7, the photoresist 62 (of FIG. 6) has been stripped and a conformal layer of oxide is deposited followed by an anisotropic oxide etch to form vertical oxide spacers 71 that adhere to the vertical walls created during the buried contact 61 etch.

Figure 8:
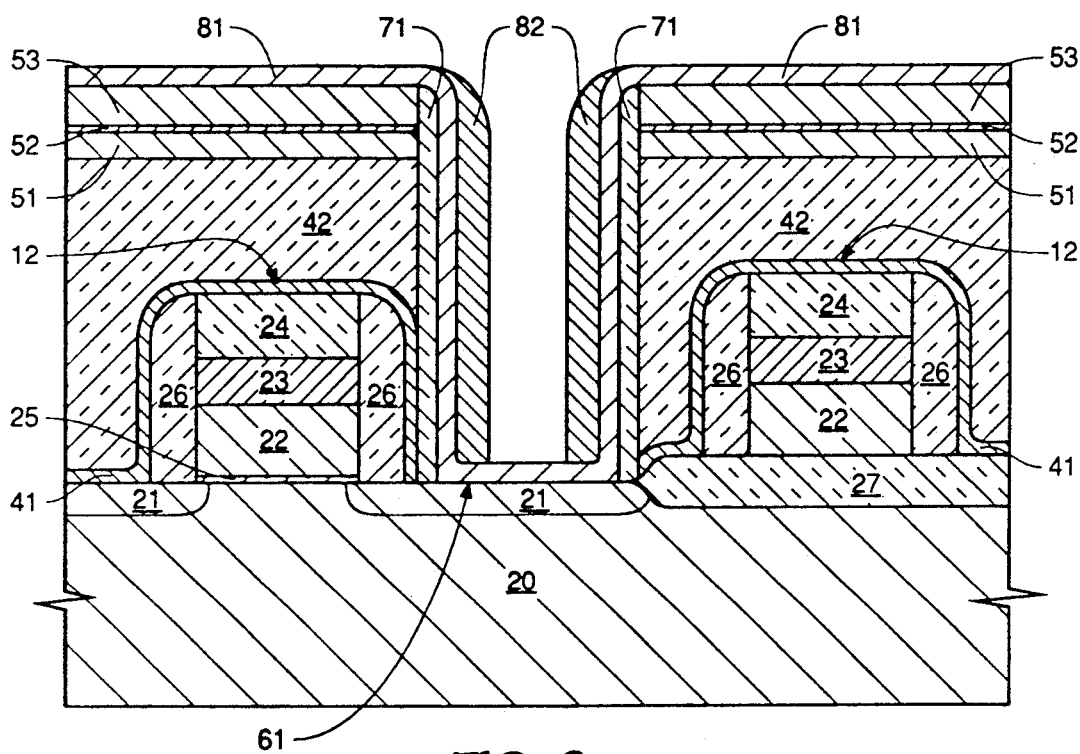
FIG. 8 is a cross-sectional view of the in-process wafer portion of FIG. 7, following deposition of a conformal polysilicon layer, a conformal nitride layer and a nitride spacer etch.

As shown in FIG. 8, conformal poly layer 81 is deposited over the entire array surface and connects to active area 21 via buried contact 61. Following poly 81 deposition, a layer of nitride is deposited and then isotropically etched to form vertical nitride spacers 82 adhering to the vertical portion of poly 81.

Figure 9:
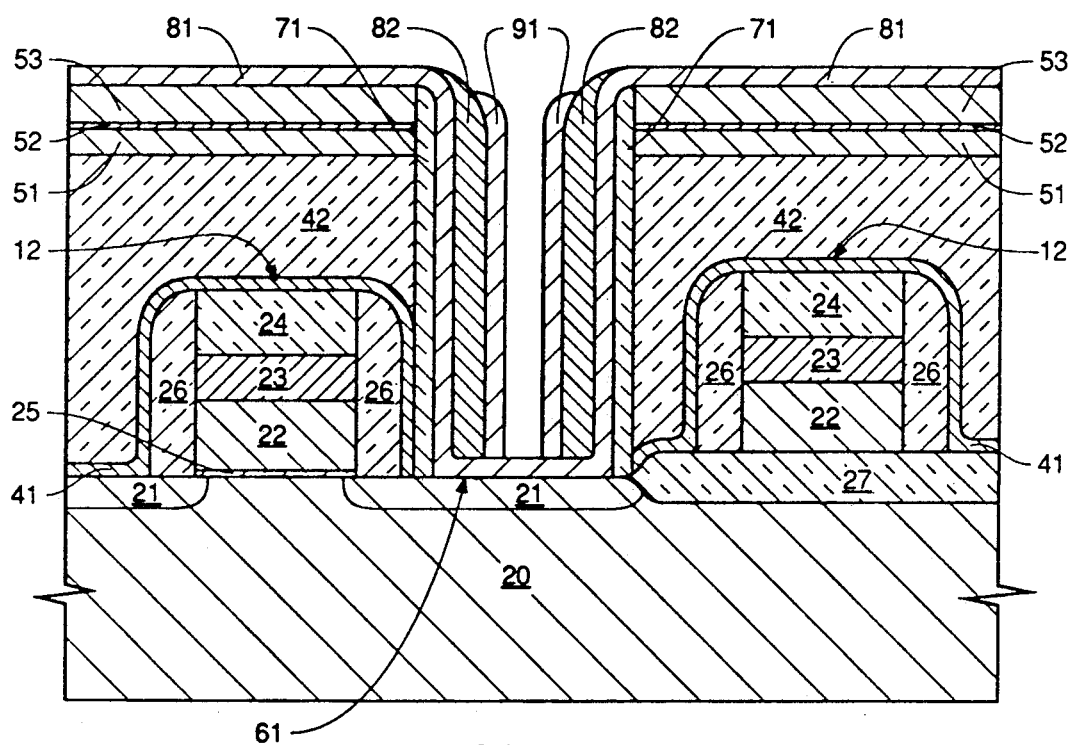
FIG. 9 is a cross-sectional view of the in-process wafer portion of FIG. 8, after a polysilicon deposition followed by a poly spacer etch.

As shown in FIG. 9, a conformal layer of poly is deposited, followed by an anisotropic etch to form vertical poly spacers 91 adjacent nitride spacers 82 with poly spacers coupling to previously deposited poly 81.

Figure 10:
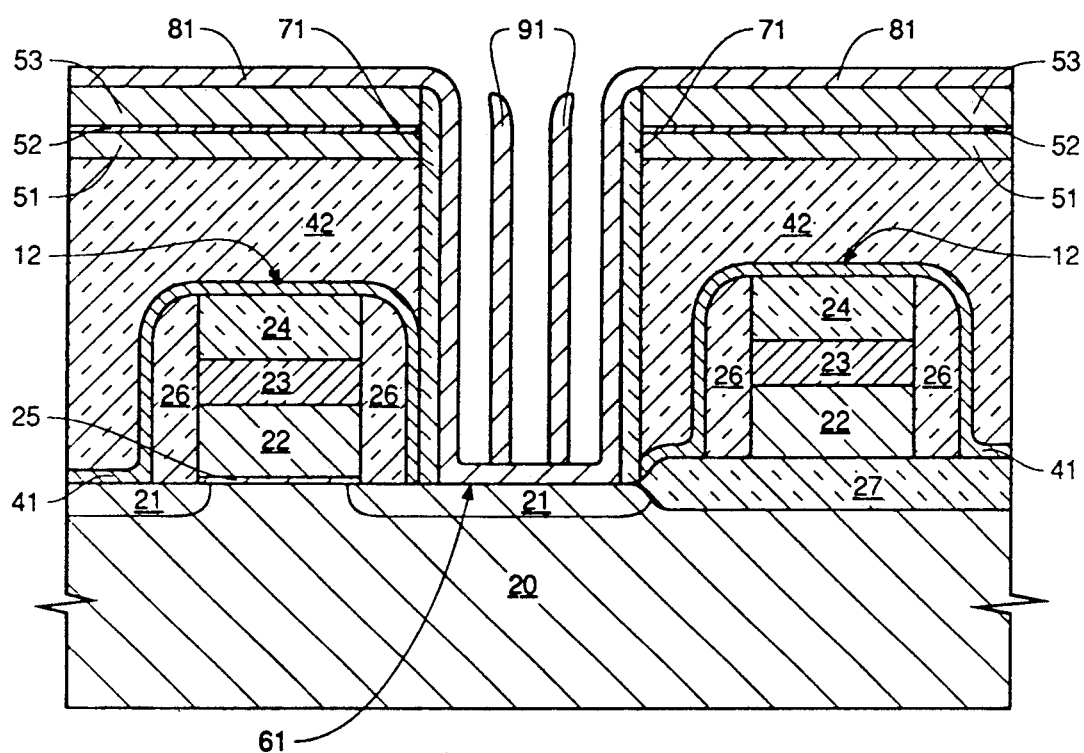
FIG. 10 is a cross-sectional view of the in-process wafer portion of FIG. 9, following a nitride wet etch of said nitride spacers.

As shown in FIG. 10, nitride spacers 82 (seen in FIG. 8) are etched away leaving poly spacers 91 free standing in vertical wall formations and residing in the buried contact opening. The number of vertical walls formed by poly spacers 91 is limited only by a given fabrication process' critical dimension. Thus as smaller line widths are achieved (such as 0.2u) the number of vertical poly walls could be increased.

Figure 11A:
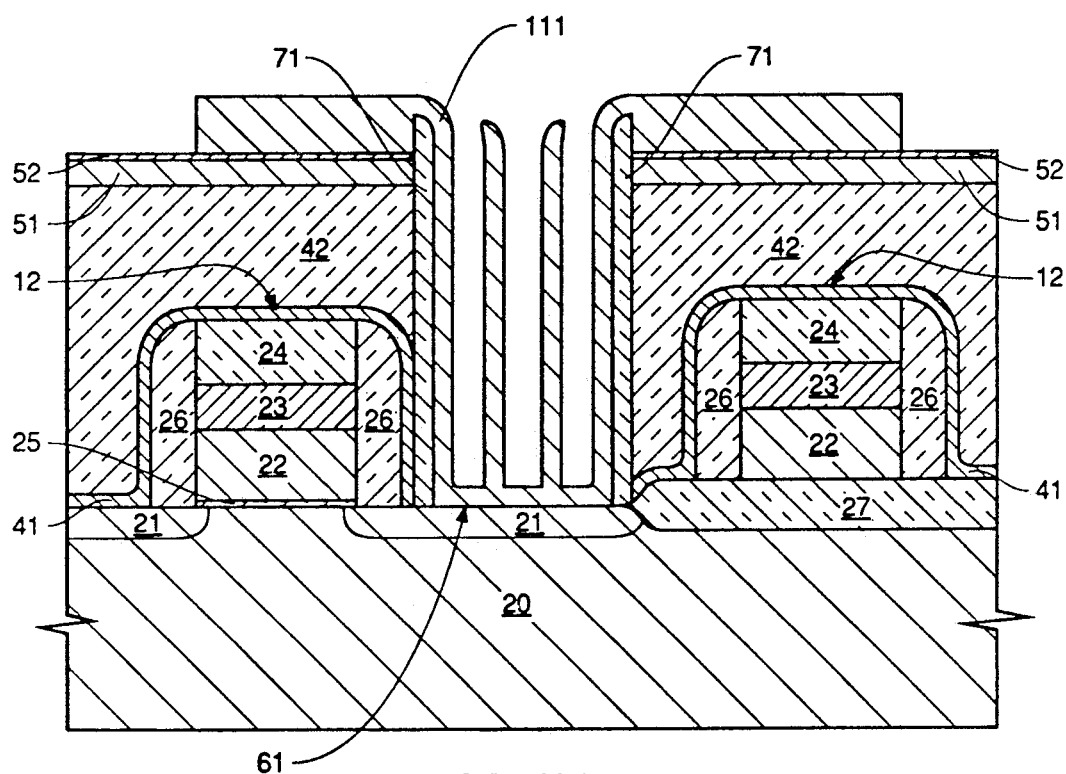
FIG. 11a is a cross-sectional view of the in-process wafer portion of FIG. 10, following masking and etching of a poly storage node plate, with said etching stopping at said cell dielectric film.
Figure 11B:
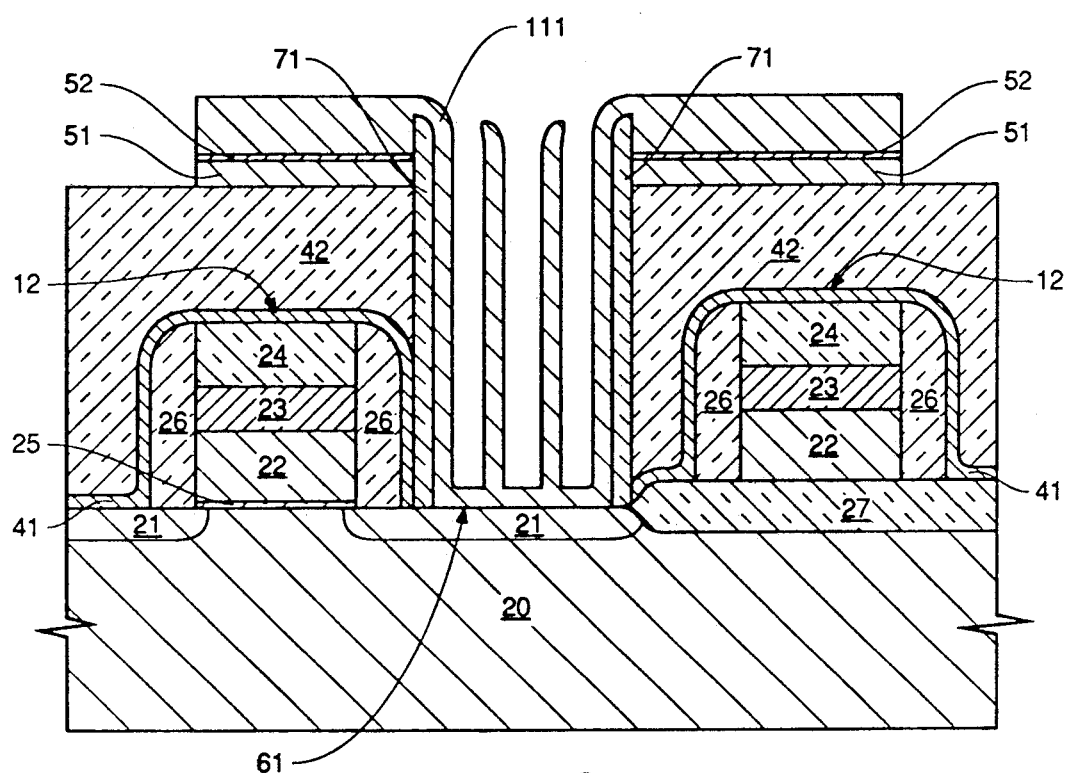
FIG. 11b is a cross-sectional view of the in-process wafer portion of FIG. 10, following masking and etching of a poly storage node plate, with said etching stopping at said planarized oxide.

As shown in FIGS. 11a and 11b, a bottom poly plate of the MDSC is patterned and etched to serve as storage node plate 111. Poly plate 111 comprises poly 53, poly 81 and poly spacers 91 (of FIG. 10) physically connected together. Poly plate 111 can be texturized by conventional texturization techniques to further increase the storage node plate's surface area. As shown in FIG. 11a the etch performed to form rectangular box shaped poly plate 111 is controlled to stop on cell dielectric film 52. Alternatively, as shown in FIG. 11b the etch to form rectangular box shaped poly plate 111 continues through both cell dielectric film 52 and poly 51 and stops when reaching planarized oxide 42. As seen in both FIGS. 11a and 11b dielectric film 52 insulates poly 51 from poly plate 111.

Figure 12A:
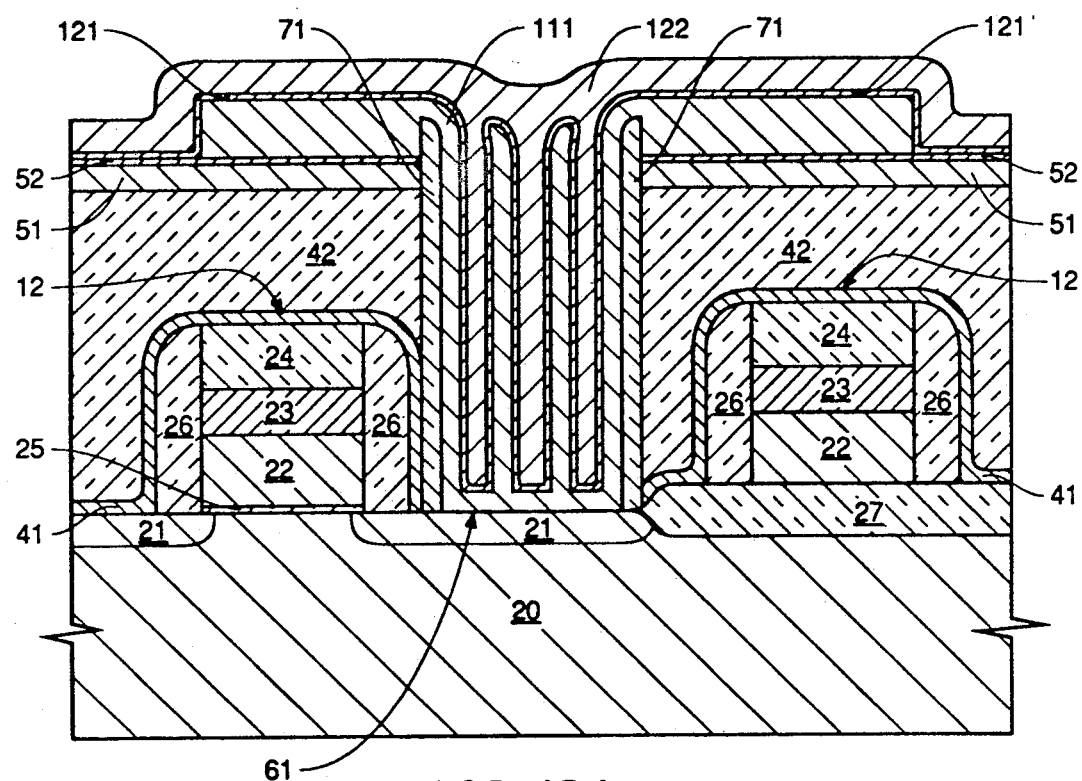
FIGS. 12a and 12b are cross-sectional views of the in-process wafer portion of FIGS. 11a and 11b respectively, following depositions of conformal cell dielectric and a poly cell plate.
Figure 12B:
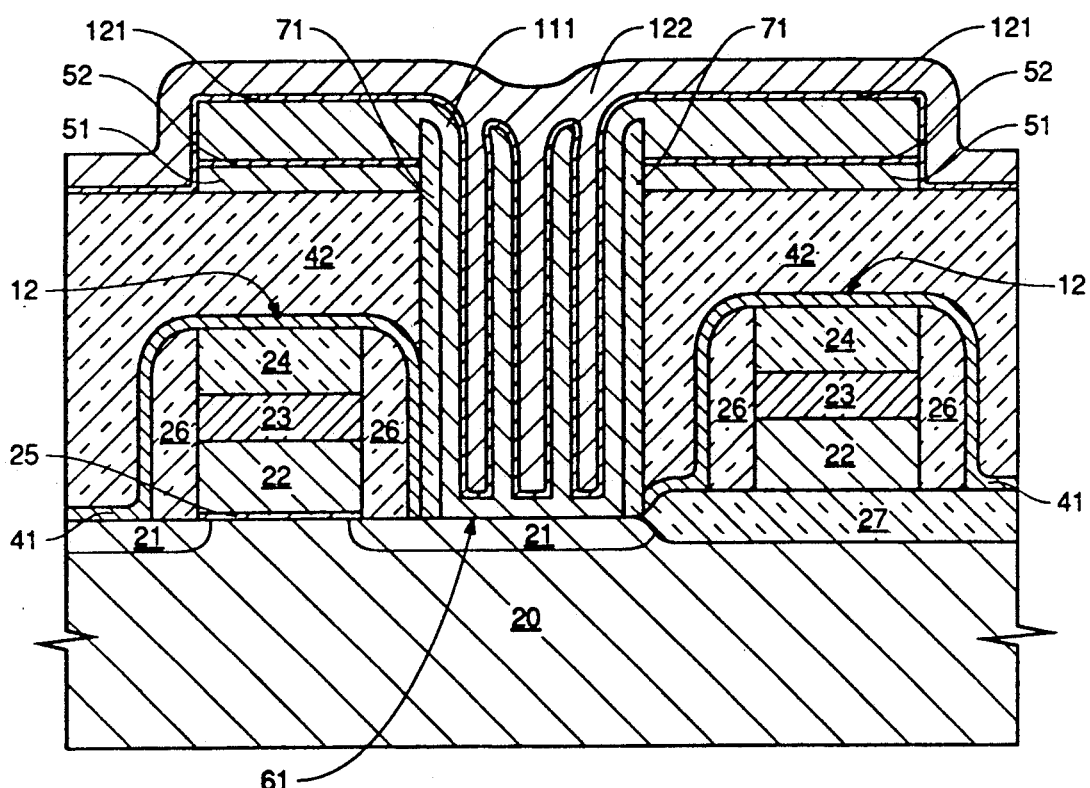

FIGS. 12a and 12b follow the previous process steps of FIGS. 11a and 11b, respectively. As shown in FIGS. 12a and 12b, a dielectric layer 121 is deposited that conforms to poly plate 111. Dielectric 121 can be from materials having a high dielectric constant such as nitride, an oxide-nitride compound or $Ta_2O_5$. Dielectric 121 serves as a cell dielectric for the MDSC. Following cell dielectric 121 deposition, a blanket deposition of conformal poly 122 is deposited. As an alternative, poly 122 can be deposited to any desired thickness and then planarized to aid in making subsequent process steps easier to perform. Poly plate 111 and poly 122 are conductively doped either n-type or p-type depending on the conductivity type desired for active area 21. Poly 122 now serves as one poly capacitor cell plate, while poly 51 as a second poly capacitor cell plate by contacting to poly 122 at the array periphery of the MDSC storage capacitor. Poly 122 and poly 51 form double capacitor cell plates which becomes a common cell plate to all MDSC storage capacitors in the array.

With the 3-dimensional shape and texturized surface of poly storage node plate 111, along with double poly capacitor cell plates 122 and 51 that envelop plate 111, substantial capacitor plate surface area is gained at the storage node. Because capacitance is mainly affected by surface area of a capacitor's storage node plates, the area gained can provide an additional 100% or more increase in capacitance over that of a conventional STC capacitor, without more space than that required for defining a stacked capacitor storage cell.

Throughout the preferred embodiment, polysilicon is deposited and conductively doped to serve as conductive lines and capacitor plates, however many materials that possess conductive qualities and that can be deposited may be used in place of polysilicon if so desired. It is therefore, to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the following sequence of steps:

creating a plurality of separately isolated active areas arranged in parallel interdigitated rows and parallel non-interdigitated columns;

creating a gate dielectric layer on top of each active area;

depositing a first conductive layer superjacent surface of said array;

depositing a first dielectric layer superjacent said first conductive layer;

masking and etching said first conductive and said first dielectric layers to form a plurality of parallel conductive word lines aligned along said rows such that each said word line passes over a inner portion of each said active area being separated therefrom by a remanent of said gate dielectric layer;

creating of a conductively-doped digit line junction and storage node junction within each said active area on opposite sides of each said word line;

depositing a second dielectric layer superjacent said array surface;

creating a first aligned buried contact location at each said digit line junction in each said active area;

depositing a second conductive layer superjacent said array surface, said second conductive layer making direct contact to said digit line junctions at said first buried contact locations;

depositing a third dielectric layer superjacent to said second conductive layer;

masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

depositing and planarizing a first oxide layer on surface of said silicon;

depositing a third conductive layer superjacent said planarized first oxide layer;

depositing a first cell dielectric layer superjacent said third conductive layer;

depositing a fourth conductive layer superjacent said first cell dielectric layer;

masking and etching a buried contact location allowing access to an active area and thereby forming vertical sidewalls within opening of said buried contact location;

depositing and anisotropically etching a second oxide layer to form vertical oxide spacers adjacent said vertical sidewalls of buried contact opening;

depositing a fifth conductive layer superjacent and coextensive said fourth conductive layer, said vertical oxide spacers and exposed surface of said active area;

depositing and anisotropically etching a nitride layer to form vertical nitride spacers adjacent vertical sidewalls of said fifth conductive layer residing in said buried contact opening;

depositing and anisotropically etching a sixth conductive layer to form vertical conductive spacers adjacent said vertical nitride spacers with lower ends of said conductive spacers making contact to said fifth conductive layer inside said buried contact opening;

isotropically etching said vertical nitride spacers thereby leaving a multiple of said vertical conductive spacers residing free-standing in said buried contact opening;

patterning said fourth and said fifth conductive layers to form a rectangular box-shaped conductive structure surrounding and connecting to said vertical conductive spacers thereby forming a storage node plate;

depositing a second cell dielectric layer superjacent and coextensive with said storage node plate; and depositing a seventh conductive layer superjacent and coextensive with said storage node plate, thereby forming a top cell plate, said top cell plate connecting to said third conductive layer, said third conductive layer forming a bottom cell plate with said top and said bottom cell plates combining to form a double cell plate common to the entire memory array.

2. A process as recited in claim 1, wherein said gate dielectric layer is oxide.

3. A process as recited in claim 1, wherein said first and said second conductive layers comprise a layer of tungsten silicide and a layer of conductively-doped polysilicon.

4. A process as recited in claim 1, wherein said first and said second dielectric layers are selected from the group consisting essentially of oxide or nitride.

5. A process as recited in claim 1, wherein said third dielectric layer is oxide.

6. A process as recited in claim 1, wherein said third, said fourth, said fifth, said sixth and said seventh conductive layers are conductively-doped polysilicon.

7. A process as recited in claim 1, wherein said second, said third dielectric layers and said first and said second cell dielectric layers are deposited by chemical vapor deposition.

8. A process as recited in claim 1, wherein said first and said second cell dielectric layers are selected from the group consisting essentially of oxide, an oxide-nitride compound, or $Ta_2O_5$.

9. A process as recited in claim 1, wherein said patterning of said fourth and said fifth conductive layers further comprises anisotropically etching the exposed fourth and fifth conductive layers with said etch stopping on said first cell dielectric.

10. A process as recited in claim 1, wherein said patterning of said fourth and said fifth conductive layers further comprises anisotropically etching the exposed fourth and fifth conductive layers with said etch continuing through said first cell dielectric and anisotropically etching underlying said third conductive layer, said etch stopping on said planarized first oxide layer.

11. A process for fabricating a DRAM storage capacitor on a silicon substrate having active areas, word lines and digit lines, said process comprising the following sequence of steps:

depositing and planarizing a first oxide layer on surface of said silicon;

depositing a first conductive layer superjacent said planarized first oxide layer;

depositing a first cell dielectric layer superjacent said first conductive layer;

depositing a second conductive layer superjacent said first cell dielectric layer;

masking and etching a buried contact location allowing access to an active area and thereby forming vertical sidewalls within opening of said buried contact location;

depositing and anisotropically etching a second oxide layer to form vertical oxide spacers adjacent said vertical sidewalls of buried contact opening;

depositing a third conductive layer superjacent and coextensive said second conductive layer, said vertical oxide spacers and exposed surface of said active area;

depositing and anisotropically etching a nitride layer to form vertical nitride spacers adjacent vertical sidewalls of said third conductive layer residing in said buried contact opening;

depositing and anisotropically etching a fourth conductive layer to form vertical conductive spacers adjacent said vertical nitride spacers with lower ends of said conductive spacers making contact to said third conductive layer inside said buried contact opening;

isotropically etching said vertical nitride spacers thereby leaving a multiple of said vertical conductive spacers residing free-standing in said buried contact opening;

patterning said second and said third conductive layers to form a rectangular box-shaped conductive structure surrounding and connecting to said vertical conductive spacers thereby forming a storage node plate;

depositing a second cell dielectric layer superjacent and coextensive with said storage node plate; and depositing a fifth conductive layer superjacent and coextensive with said storage node plate, thereby forming a top cell plate, said top cell plate connecting to said first conductive layer, said first conductive layer forming a bottom cell plate with said top and said bottom cell plates combining to form a double cell plate common to the entire memory array.

12. A process as recited in claim 11, wherein said first, said second, said third, said fourth and said fifth conductive layers are conductively-doped polysilicon.

13. A process as recited in claim 11, wherein said first and said cell dielectric layers are selected from the group consisting essentially of oxide, an oxide-nitride compound, or $Ta_2O_5$.

14. A process as recited in claim 11, wherein said patterning said second and said third conductive layers further comprises anisotropically etching the exposed second and third conductive layers with said etch stopping on said first cell dielectric.

15. A process as recited in claim 11, wherein said patterning said second and said third conductive layers further comprises anisotropically etching the exposed second and fourth conductive layers with said etch continuing through said first cell dielectric and anisotropically etching underlying said first conductive layer, said etch stopping on said planarized first oxide layer.

* * * * *

UNITED STATES PATENT AND TRADEMARK OFFICE
CERTIFICATE OF CORRECTION

PATENT NO. : 5,126,280
DATED : June 30, 1992
INVENTOR(S) : Hiang C. Chan, et al

It is certified that error appears in the above-indentified patent and that said Letters Patent is hereby corrected as shown below:

Column 6, line 60, delete "storage node plate", and insert --second cell dielectric layer --.

Column 8, line 25, delete "storage node plate", and insert --second cell dielectric layer --.

Signed and Sealed this

Eighth Day of February, 1994

Attest:

BRUCE LEHMAN

Attesting Officer     Commissioner of Patents and Trademarks